(12) United States Patent
Sumita et al.

(10) Patent No.: US 7,124,339 B2
(45) Date of Patent: Oct. 17, 2006

(54) SCAN PATH CIRCUIT AND SEMICONDUCTOR INTEGRATED CIRCUIT COMPRISING THE SCAN PATH CIRCUIT

(75) Inventors: Masaya Sumita, Hyogo (JP); Akira Miyoshi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 405 days.

(21) Appl. No.: 10/417,208

(22) Filed: Apr. 17, 2003

(65) Prior Publication Data

US 2004/0004888 A1    Jan. 8, 2004

(30) Foreign Application Priority Data

Apr. 18, 2002 (JP) .......................... P. 2002-116249

(51) Int. Cl.
G01R 31/028 (2006.01)
H03K 3/289 (2006.01)
(52) U.S. Cl. ...................... 714/727; 327/202
(58) Field of Classification Search ............... 714/724, 714/726, 727, 729; 327/202
See application file for complete search history.

(56) References Cited

U.S. PATENT DOCUMENTS 6,073,260 A * 6/2000 Kurita .................... 714/724

FOREIGN PATENT DOCUMENTS

| JP | 63-276913 | 11/1988 |
|----|-----------|---------|
| JP | 07-95016  | 4/1995  |
| JP | 09-83307  | 3/1997  |
| JP | 09-320290 | 12/1997 |
| JP | 09-330349 | 12/1997 |
| JP | 2002-9238 | 1/2002  |

* cited by examiner

Primary Examiner—James C. Kerveros
(74) Attorney, Agent, or Firm—McDermott Will & Emery LLP

(57) ABSTRACT

Each of D flip-flops (FFs) 13a to 13f constituting a scan path circuit has a normal operation input circuit to be selected in a normal operation and a test operation input circuit to be selected in a test operation, and a control signal having an intermediate voltage between a supply voltage and a ground voltage is sent from a voltage generating circuit 17 to the test operation input circuit of each FF in the test operation. In this case, the amount of an output change in data in each FF is smoother than that in the case in which the supply voltage is applied. Consequently, the delay time of the data is increased. The intermediate voltage to be applied to each FF in the test operation is determined based on a feedback signal sent from a test circuit 15 for checking whether scanned-out data have an error or not.

8 Claims, 13 Drawing Sheets

SCAN PATH CIRCUIT AND SEMICONDUCTOR INTEGRATED CIRCUIT COMPRISING THE SCAN PATH CIRCUIT

BACKGROUND OF THE INVENTION

1. Field of the Invention

The present invention relates to a scan path circuit constituted by a flip-flop having a scan function and a semiconductor integrated circuit comprising the scan path circuit.

2. Description of the Related Art

At present, semiconductor integrated circuits having circuit scales extending over 2000000 to 3000000 gates are designed. If so many logic circuits are to be completely tested, the amount of a test pattern and a time required for the test are enormously demanded. Therefore, a so-called test facilitating design has been carried out. In the test facilitating design, the policy of a failure test is decided in the stage of a circuit design and a test circuit is fabricated into a semiconductor integrated circuit to predict the cause of a failure and the circuit design is carried out such that a failure portion can easily be detected and diagnosed.

Examples of a method of carrying out such a failure test include a "scan path method". In the scan path method, a sequential circuit is operated as a shift register to carry out a test. For example, in a conventional logic circuit shown in FIG. 14 which is constituted by D flip-flops 41 to 46 forming the sequential circuit and a combinational circuit 40, the flip-flops are connected to form a san path (a path for a test mode), thereby replacing each of the flip-flops with a scan flip-flop and operating the sequential circuit as a shift register. Then, data are scanned in and it is decided whether data scanned out are coincident with an expected value or not. Thus, the failure test is carried out.

The normal operation and test operation of the logic circuit shown in FIG. 14 will be described below.

First of all, during the normal operation, three sets of data are input from the D flip-flops (hereinafter referred to as "FFs") 41 to 43 to the combinational circuit 40. Therefore, the combinational circuit 40 carries out a logical operation for the three sets of data, thereby outputting the three sets of data. The FFs 44 to 46 send the three sets of outputs to the outside.

During the test operation, the FFs 41 to 46 form a scan flip-flop, that is, a so-called scan path. The FFs 41 to 43 sequentially shift data input from an external test device synchronously with a predetermined clock. The combinational circuit 40 carries out a logical operation for the data given from the FFs 41 to 43 and outputs three sets of results of the operation. The FFs 44 to 46 sequentially shift the results of the operation which are given from the combinational circuit 40 and output the results to the outside. Since the output data include the results of the operation of the combinational circuit 40, it is decided whether the same results are coincident with an expected value or not. Thus, the failure of the combinational circuit 40 is decided.

However, in the case in which a shift register is constituted by a flip-flop as described above in the progress of the microfabrication process of a semiconductor integrated circuit, there is a possibility that a malfunction such as a hold error (a shift omission) might be caused, during a scan shift operation, by a clock skew, a variation in a device, a variation in a wiring or a cross talk. When the malfunction is generated, the reliability of a failure test is deteriorated. Consequently, there is a problem in that a yield is deteriorated. Such a problem can be solved by increasing a delay time in the scan shift operation. Consequently, an inverter and a latch for delaying a signal are provided between the flip-flops.

However, a problem is pointed out such that the inverter and the latch cannot cope with a variation in the delay characteristic of a device because they carry out a fixed delay. When the microfabrication process progresses, the variation in the device is increased. If the delay characteristic is not fixed but variable, the delay characteristic can be changed corresponding to each circuit. Consequently, it is possible to reliably prevent a malfunction such as a hold error. Accordingly, there has been desired a scan path circuit capable of flexibly coping with the variation in the delay characteristic of the device.

In a scan path circuit comprising an inverter and a latch, moreover, an extra area for mounting the inverter or the latch is required. Consequently, there is a problem in that the mounting area is increased. Accordingly, there has been desired a scan path circuit having a small mounting area which can prevent the malfunction of a scan shift operation to reliably carry out a failure test even if the inverter and the latch are not provided.

SUMMARY OF THE INVENTION

In consideration of the conventional problems and demands, therefore, it is an object of the invention to provide a scan path circuit capable of flexibly coping with a variation in the delay characteristic of a device and a semiconductor integrated circuit comprising the scan path circuit. Moreover, it is another object of the invention to provide a scan path circuit having a small mounting area which can prevent the malfunction of a scan shift operation and a semiconductor integrated circuit comprising the scan path circuit.

In order to attain the objects, the present invention provides a scan path circuit constituted by a plurality of flip-flops or data holding circuits which is operated as a shift register in a separate mode from a normal mode, each of the flip-flops comprising a first input circuit which is selected in the normal mode and inputs data in a predetermined timing in the normal mode, a second input circuit which is selected in the separate mode from the normal mode and inputs data in a predetermined timing in the separate mode, and an output circuit for outputting predetermined data corresponding to the data input to the first input circuit or the second input circuit, the first input circuit and the second input circuit having terminals to which different control signals for each mode are input, respectively, and a voltage level of a control signal input to the terminal of the second input circuit being changed in the separate mode from the normal mode.

When the voltage level of the control signal ranges between a supply voltage and a ground voltage as in the invention, the amount of a change in the data output from the second input circuit is smoother than that in the case in which the supply voltage is applied. Consequently, the delay time of the data is increased. If the delay time can be thus increased, it is not necessary to constitute an inverter and a latch. Therefore, a mounting area can be reduced. Even if the delay characteristic of a device has a variation, moreover, a countermeasure can be taken flexibly.

Moreover, the invention provides a scan path circuit constituted by a plurality of flip-flops which is operated as a shift register in a separate mode from a normal mode, each of the flip-flops comprising a first input circuit which is selected in the normal mode and inputs data in a predetermined timing in the normal mode, a plurality of second input circuits which are selected in the separate mode from the normal mode and have different amounts of an output change of data input in a predetermined timing in the separate mode, and an output circuit for outputting predetermined data corresponding to the data input to the first input circuit or the second input circuits, the first input circuit and the second input circuits having terminals to which different control signals for each mode are input, respectively, and a voltage level of a control signal input to any of the terminals of the second input circuits being changed in the separate mode from the normal mode. Accordingly, if a proper circuit is selected from the second input circuits, the delay time can be set variably. Even if the delay characteristic of a device has a variation, therefore, a countermeasure can be taken flexibly.

Furthermore, the invention provides a scan path circuit constituted by a plurality of flip-flops which is operated as a shift register in a separate mode from a normal mode, each of the flip-flops comprising an input circuit for inputting data in a predetermined timing, and an output circuit for outputting predetermined data corresponding to the data input to the input circuit, a delay time of the data to be output from the output circuit from the data input to the input circuit being varied in the normal mode and the separate mode from the normal mode. Accordingly, a delay from the rise time of the clock input of the flip-flop circuit to the output is prolonged. Consequently, a hold error is made with difficulty.

In the scan path circuit according to the invention, moreover, the first input circuit or the second input circuit is constituted by a tri-state inverter circuit to be controlled by the control signal and the input data, and an output of the tri-state inverter circuit is connected in common.

In the scan path circuit according to the invention, furthermore, the first input circuit or the second input circuit is constituted by a transfer gate circuit to be controlled by the control signal and the input data, and an output of the transfer gate circuit is connected in common. Accordingly, the number of elements can further be decreased.

In the scan path circuit according to the invention, moreover, the tri-state inverter circuit applies a voltage having the same level as that of the control signal in place of a supply voltage and applies a voltage having a value obtained by subtracting the voltage having the same level as that of the control signal from the supply voltage in place of a ground voltage in the normal mode. In this case, a backward bias is applied so that a junction leakage current (a subthreshold leakage current) is decreased. Accordingly, a consumed current can be reduced.

In the scan path circuit according to the invention, furthermore, a substrate bias voltage of the tri-state inverter circuit is the voltage having the same level as that of the control signal or a voltage having a value obtained by subtracting the voltage having the same level as that of the control signal from a supply voltage in the normal mode. In this case, a forward bias is applied so that the junction leakage current is increased. As a result, a voltage drop is increased so that the source-drain current of an MOSFET is reduced. Since the drain current is reduced, the delay time can be increased.

In the scan path circuit according to the invention, moreover, the voltage having the same level as that of the control signal is applied in place of a supply voltage of the flip-flop and a voltage having a value obtained by subtracting the voltage having the same level as that of the control signal from the supply voltage is applied in place of a ground voltage of the flip-flop in the separate mode from the normal mode. In this case, the consumed current can be reduced and the delay time can be increased.

Furthermore, the invention provides a semiconductor integrated circuit comprising the scan path circuit (hereinafter referred to as a "first scan path circuit") according to the first, second, third, fourth, fifth, sixth, seventh or eighth aspect of the invention which scans in data in a separate mode from a normal mode, a combinational circuit for carrying out a logical operation over the data input from the first scan path circuit, the scan path circuit (hereinafter referred to as a "second scan path circuit") according to the first, second, third, fourth, fifth, sixth, seventh or eighth aspect of the invention which scans out data in the separate mode from the normal mode, and control signal generating means for generating a control signal to be input to each terminal of a second input circuit provided in the first scan path circuit and the second scan path circuit.

In the semiconductor integrated circuit according to the invention, moreover, the control signal generating means changes a voltage level of the control signal based on a signal received when the data scanned out from the second scan path circuit include an error as a result of a check of the same scanned-out data in the separate mode from the normal mode. When the voltage level of the control signal is changed, the delay time is also varied. Even if the delay characteristic of the device has a variation, therefore, a countermeasure can be taken flexibly. Even if a microfabrication process progresses so that the variation in the device is increased, accordingly, a malfunction such as a hold error can be prevented.

Furthermore, the semiconductor integrated circuit according to the invention further comprises checking means for checking whether or not the data scanned out from the second scan path circuit include an error in the separate mode from the normal mode, the checking means outputting, to the control signal generating means, a feedback signal for changing the voltage level of the control signal when the scanned-out data include an error as a result of the check.

In the semiconductor integrated circuit according to the invention, moreover, the checking means includes the same number of coincidence deciding means as the number of scan chain stages of the first scan path circuit and the second scan path circuit which serve to decide whether or not a preset expected value is coincident with 1-bit data which are scanned out, full coincidence deciding means for deciding whether or not all data are coincident with each other by the coincidence deciding means, counter means for incrementing when it is decided that any data are not coincident by the full coincidence deciding means, and feedback signal output means for outputting the feedback signal every time the counter means increments.

Furthermore, the semiconductor integrated circuit according to the invention further comprises voltage deciding means for deciding whether the control signal output from the control signal generating means has a desirable voltage level or not.

In the semiconductor integrated circuit according to the invention, moreover, the first scan path circuit shifts data which are scanned in, the combinational circuit carries out a logical operation over data input from the first scan path circuit, the second scan path circuit shifts and scans out data obtained from the combinational circuit, the checking means checks whether the scanned-out data include an error or not and outputs the feedback signal to the voltage deciding means if the same data include an error, and the control signal generating means resets the voltage level of the control signal based on the feedback signal.

In the semiconductor integrated circuit according to the invention, furthermore, the voltage deciding means decides whether the control signal output from the control signal generating means has a desirable voltage level or not and decides to be FAIL if the same control signal does not have the desirable voltage level.

DESCRIPTION OF THE PREFERRED EMBODIMENTS

An embodiment of a semiconductor integrated circuit according to the invention will be described below in detail with reference to the drawings in order of "First Embodiment" and "Second Embodiment". A semiconductor integrated circuit according to the embodiments carries out a failure test by a scan path method for operating, as a shift register, a sequential circuit constituted on the inside.

First Embodiment

Figure 1:
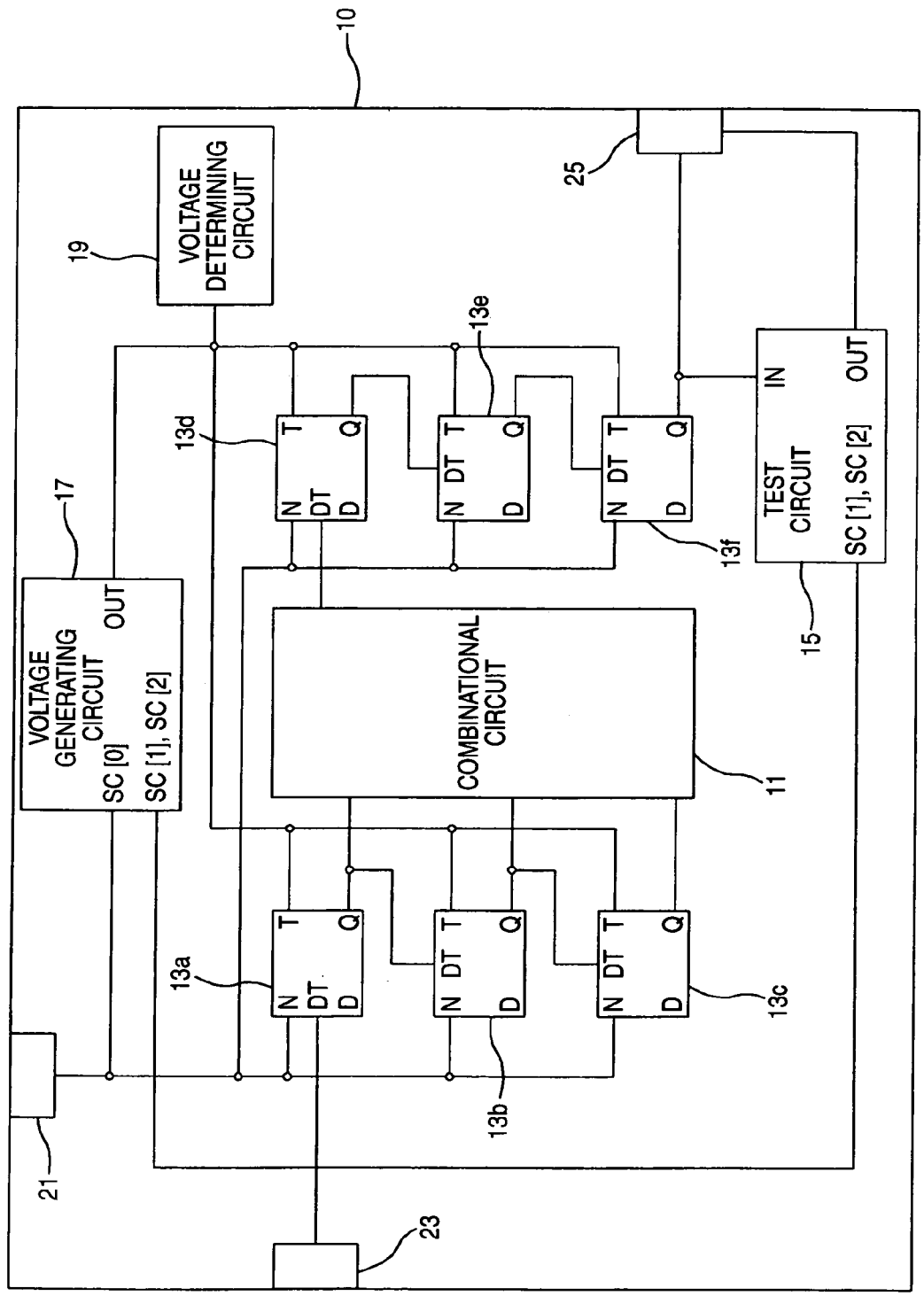
FIG. 1 is a block diagram showing a semiconductor integrated circuit according to a first embodiment of the invention.

FIG. 1 is a block diagram showing a semiconductor integrated circuit according to a first embodiment of the invention. In FIG. 1, a supply voltage $V_{DD}$ and a ground voltage $V_{SS}$ are applied to a semiconductor integrated circuit 10 according to the embodiment which comprises a combinational circuit 11, D flip-flops 13a to 13f, a test circuit 15 corresponding to checking means according to claims, a voltage generating circuit 17 corresponding to control signal generating means, a voltage determining circuit 19 corresponding to voltage deciding means, a test control terminal 21, an input terminal 23 and an output terminal 25.

In the D flip-flops (hereinafter referred to as "FFs") 13a to 13f, the FFs 13a to 13c constitute a sequential circuit on the input side of the combinational circuit 11 and the FFs 13d to 13f constitute a sequential circuit on the output side of the combinational circuit 11. A failure test is carried out by a scan path method. During a failure test operation, therefore, the FFs 13a to 13c corresponding to a first scan path circuit and the FFs 13d to 13f corresponding to a second scan path circuit in the claims constitute a scan path circuit to be operated as a shift register. FIG. 1 shows a wiring in the failure test operation (which will be hereinafter referred to as "in the test operation").

Each component of the semiconductor integrated circuit 10 according to the embodiment will be described below.

First of all, the combinational circuit 11 will be described. The combinational circuit 11 serves to carry out a logical operation for three sets of data input from the FFs 13a to 13c respectively and to output three sets of data in the same manner as in the conventional art. The three sets of data output from the combinational circuit 11 are input to the FFs 13d to 13f.

Figure 2:
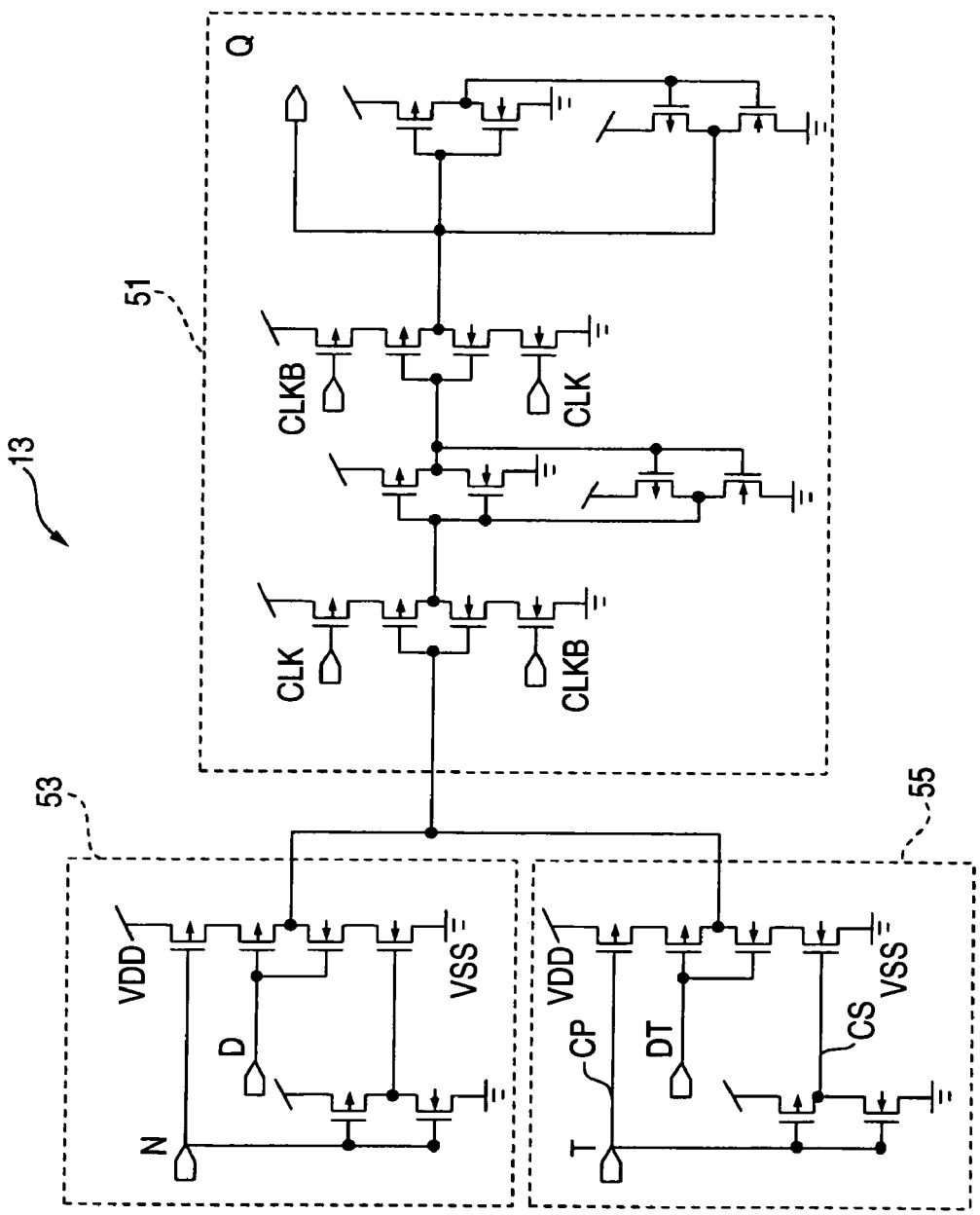
FIG. 2 is a circuit diagram showing the internal structure of a flip-flop provided in the semiconductor integrated circuit according to the first embodiment.

Next, the FFs 13a to 13f will be described. As shown in FIG. 2, the FFs 13a to 13f comprise an output circuit 51 on the output side, and a normal operation input circuit 53 corresponding to a first input circuit and a test operation input circuit 55 corresponding to a second input circuit in the claims on the input side. The output circuit 51 has a Q terminal connected to the output terminal 25. Moreover, the normal operation input circuit 53 has an N terminal selected in a normal operation and connected to the test control terminal 21, and a D terminal connected to the input terminal 23, and constitutes a tri-state inverter circuit. Moreover, the test operation input circuit 55 is selected in the test operation, has a T terminal connected to the voltage generating circuit 17 and a DT terminal connected to the input terminal 23, and constitutes a tri-state inverter circuit in the same manner as the normal operation input circuit 53. In each of the FFs, whether the normal operation input circuit 53 or the test operation input circuit 55 is to be selected is determined by each signal input to the N terminal and the T terminal.

In the embodiment, particularly, an intermediate voltage $V_M$ between the supply voltage $V_{DD}$ and the ground voltage $V_{SS}$ is applied from the voltage generating circuit 17 to the T terminal of the test operation input circuit 55 in the test operation. In the case in which the intermediate voltage $V_M$ is applied to the T terminal, the amount of a change in the output of data input to the DT terminal is smoother than that in the case in which the supply voltage $V_{DD}$ is applied. Consequently, the delay time of data output from the Q terminal of the output circuit 51 is increased. If the delay time can be thus increased, it is not necessary to constitute an inverter and a latch as in the conventional art. Therefore, the mounting area of the semiconductor integrated circuit can be reduced.

Next, the test circuit 15 will be described. The test circuit 15 serves to check, corresponding to a predetermined bit, whether or not data scanned out from the FF 13f in the rear stage constituting the sequential circuit on the output side of the combinational circuit 11 are coincident with an expected value in the test operation. If they are not coincident with each other, the test circuit 15 supplies the voltage generating circuit 17 with a feedback signal for regulating the intermediate voltage $V_M$ applied to the T terminal of each of the FFs.

Figure 3:
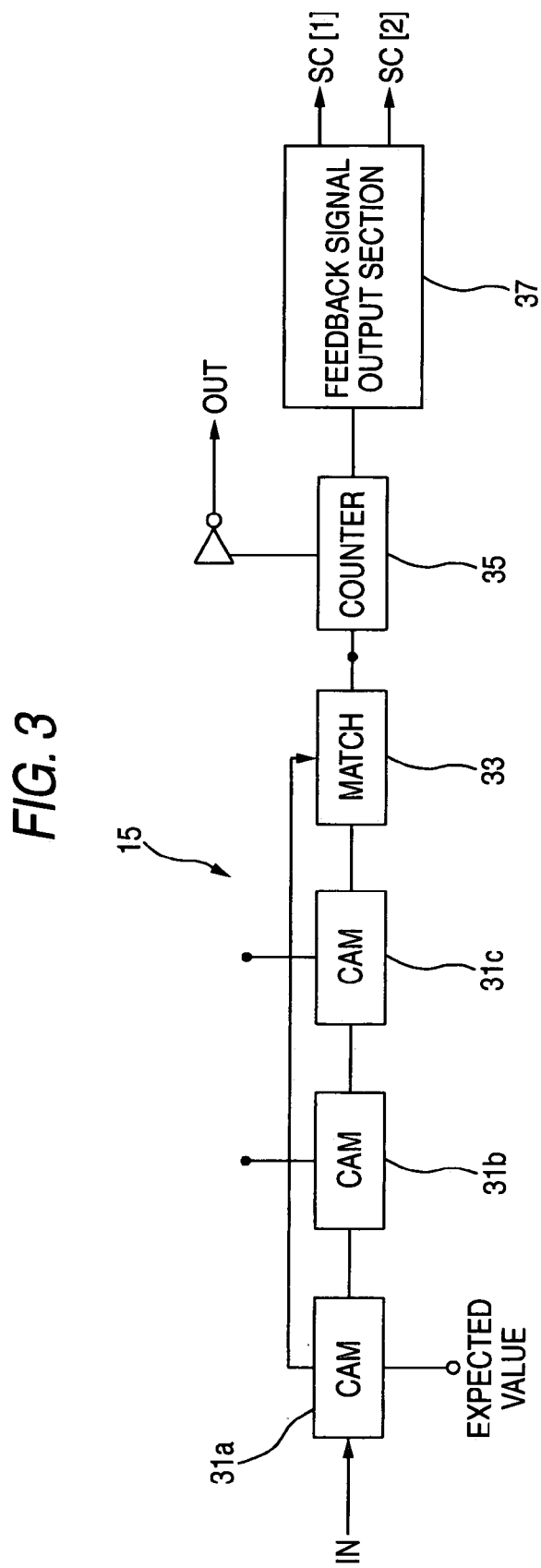
FIG. 3 is a block diagram illustrating the internal structure of a test circuit.

FIG. 3 is a block diagram illustrating the internal structure of the test circuit 15. As shown in FIG. 3, the test circuit 15 has CAM sections 31a to 31c corresponding to coincidence deciding means according to claims in the same number (three in the embodiment) as the number of the scan chain stages of the scan path circuit (the FFs 13a to 13c and 13d to 13f) connected in series, a MATCH section 33 corresponding to full coincidence deciding means, a counter 35 corresponding to counter means, and a feedback signal output section 37 corresponding to feedback signal output means.

The CAM sections 31a to 31c serve to decide whether or not a preset expected value and 1-bit data scanned out are coincident with each other, and the MATCH section 33 serves to decide whether or not all 3-bit data decided by the CAM sections 31a to 31c are coincident with each other. Moreover, the counter 35 serves to increment when the MATCH section 33 decides that any of the 3-bit data are not coincident, and the feedback signal output section 37 serves to output such a feedback signal that the intermediate potential $V_M$ increase a level by one rank every time the increment is carried out in the counter 35. In the embodiment, the feedback signal has 2 bits having SC[1] and SC[2].

Next, the voltage generating circuit 17 will be described. The voltage generating circuit 17 serves to generate the intermediate voltage $V_M$ to be applied to the T terminal of each FF in the test operation based on the feedback signals SC[1] and SC[2] sent from the test circuit 15. The voltage generating circuit 17 can generate plural kinds of intermediate voltages $V_M$, for example, ⅔ of the supply voltage $V_{DD}$ or ½ thereof. Any intermediate voltage $V_M$ to be generated and output is determined by default setting and the feedback signals SC[1] and SC[2] sent from the test circuit 15.

For example, in the embodiment, the feedback signal has 2 bits. Therefore, it is assumed that four kinds of intermediate voltages $V_M$ of "$V_{DD}/4$, $V_{DD}/3$, $V_{DD}/2$ and $2V_{DD}/3$" can be generated by the voltage generating circuit 17. At time of the start of a test, the voltage generating circuit 17 applies, to the T terminal, the lowest intermediate voltage $V_{DD}/4$ which is set to a default. Data scanned out at the intermediate voltage are checked by the test circuit 15. As a result, in the case in which the data have an error, a feedback signal for giving an instruction to set the intermediate potential to be $V_{DD}/3$ is output and input to the voltage generating circuit 17. Therefore, the voltage generating circuit 17 generates the intermediate potential $V_{DD}/3$ to be applied to the T terminal. Similarly, in the case in which the data scanned out at $V_{DD}/2$ have an error, the intermediate voltage is regulated to be $V_{DD}/2$. In the case in which $2V_{DD}/3$ having the highest level also has an error, it is decided to be FAIL and the failure test is ended.

Thus, the voltage generating circuit 17 applies the intermediate voltage $V_M$ to the T terminal of the test operation input circuit 55 of each FF in the test operation and the decision for the test operation and the normal operation is carried out in response to a signal SC[0] sent from the test control terminal 21. For this reason, the test control terminal 21 is connected to the voltage generating circuit 17 as well as the N terminal of the normal operation input circuit 53 of each FF.

Figure 4:
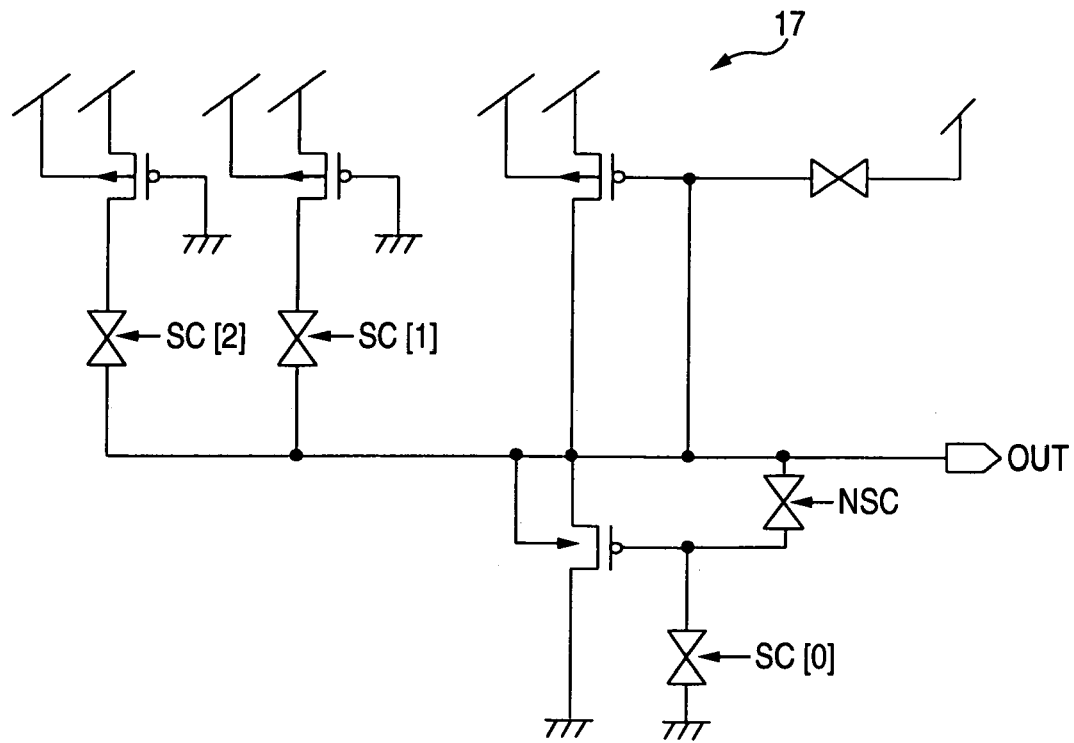
FIGS. 4(a) and 4(b) show the circuit diagrams showing the internal structures of a voltage generating circuit.
Figure 4:
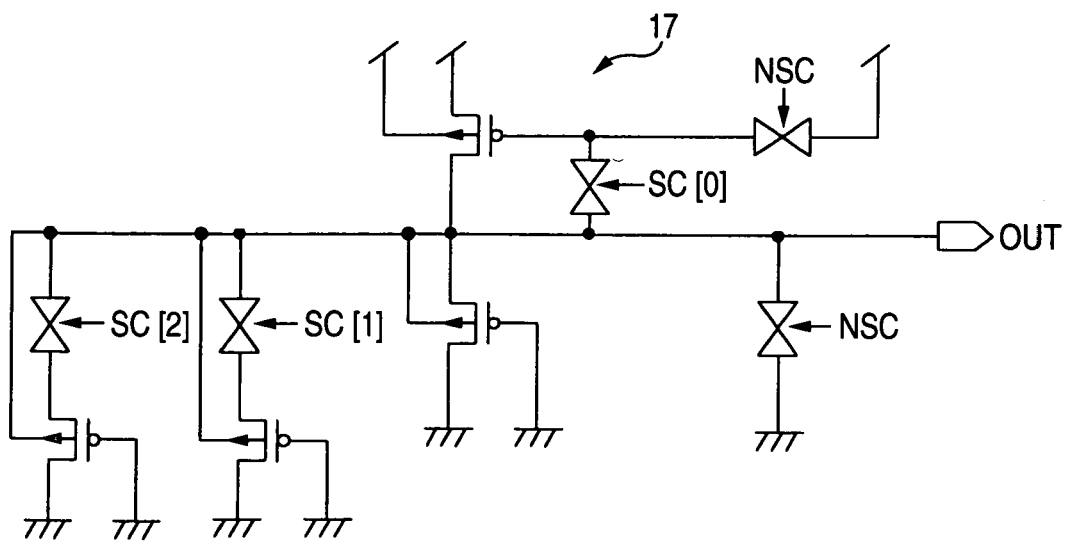

FIG. 4 is a circuit diagram showing the internal structure of the voltage generating circuit 17. FIG. 4(a) shows a first embodiment of the voltage generating circuit 17 and FIG. 4(b) shows a second embodiment of the voltage generating circuit 17. The supply voltage $V_{DD}$ is output during the normal operation in the example shown in FIG. 4(a), and the ground voltage $V_{SS}$ is output during the normal operation in the example shown in FIG. 4(b). Either of the voltage generating circuits to be used depends on the application of the same voltage to a Pch or Nch FET through the T terminal. In the FF shown in FIG. 2, the voltage generating circuit 17 in FIG. 4(a) is used.

Figure 5:
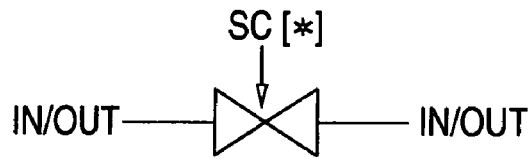
FIG. 5(a) is a conceptual diagram showing a switch element and FIG. 5(b) is a diagram showing the structure of the circuit.
Figure 5:
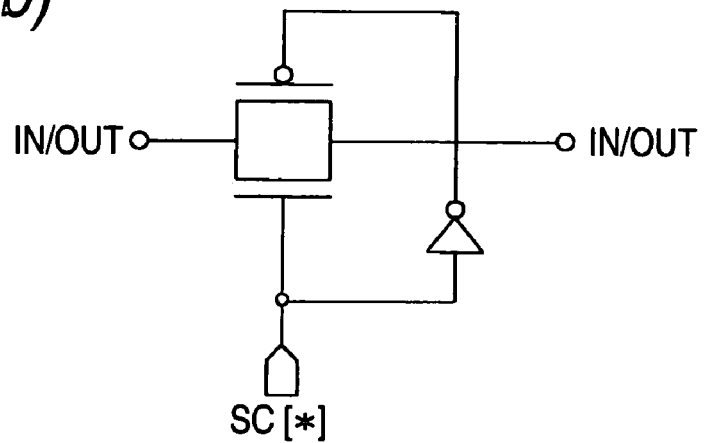

As shown in FIG. 4, moreover, the voltage generating circuit 17 has three switch elements. The signals SC[1] and SC[2] sent from the test circuit 15 and the signal SC[0] input from the test control terminal 21 are input to each of the switch elements. In FIG. 5, (a) is a conceptual diagram showing the switch element and (b) is a diagram showing the structure of a circuit.

Figure 6:
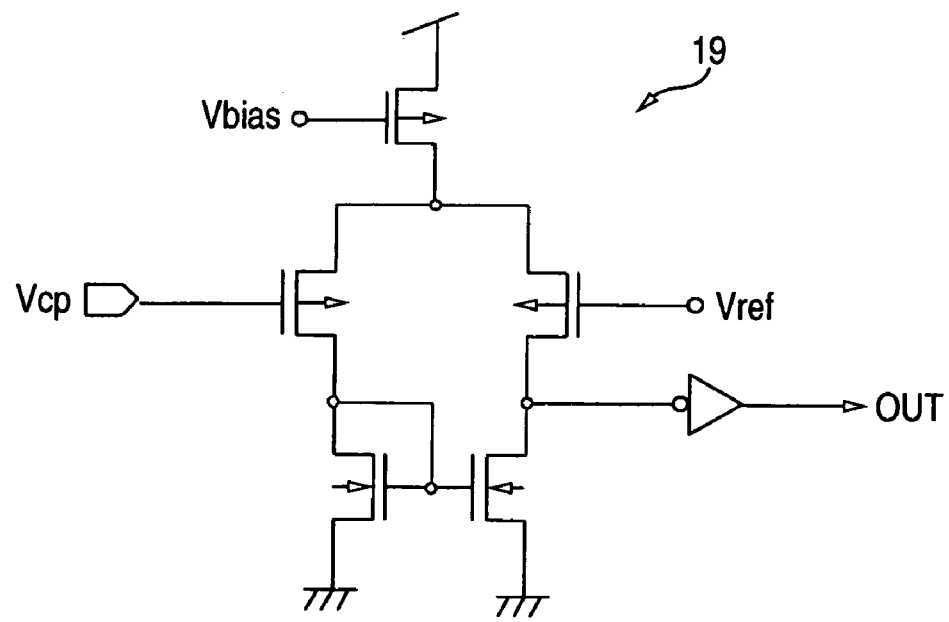
FIG. 6 is a circuit diagram showing the internal structure of a voltage determining circuit.

Next, the voltage determining circuit 19 will be described. The voltage determining circuit 19 serves to decide whether or not the intermediate voltage $V_M$ to be applied from the voltage generating circuit 17 to the T terminal of each FF has a desirable voltage level in the test operation, and to decide whether or not a signal is not output from the voltage generating circuit 17, that is, a voltage is "0" in the normal operation. In the case in which desirable conditions are not satisfied in the decision, the voltage determining circuit 19 decides to be FAIL and ends the failure test. FIG. 6 is a circuit diagram illustrating the internal structure of the voltage determining circuit 19.

Figure 7:
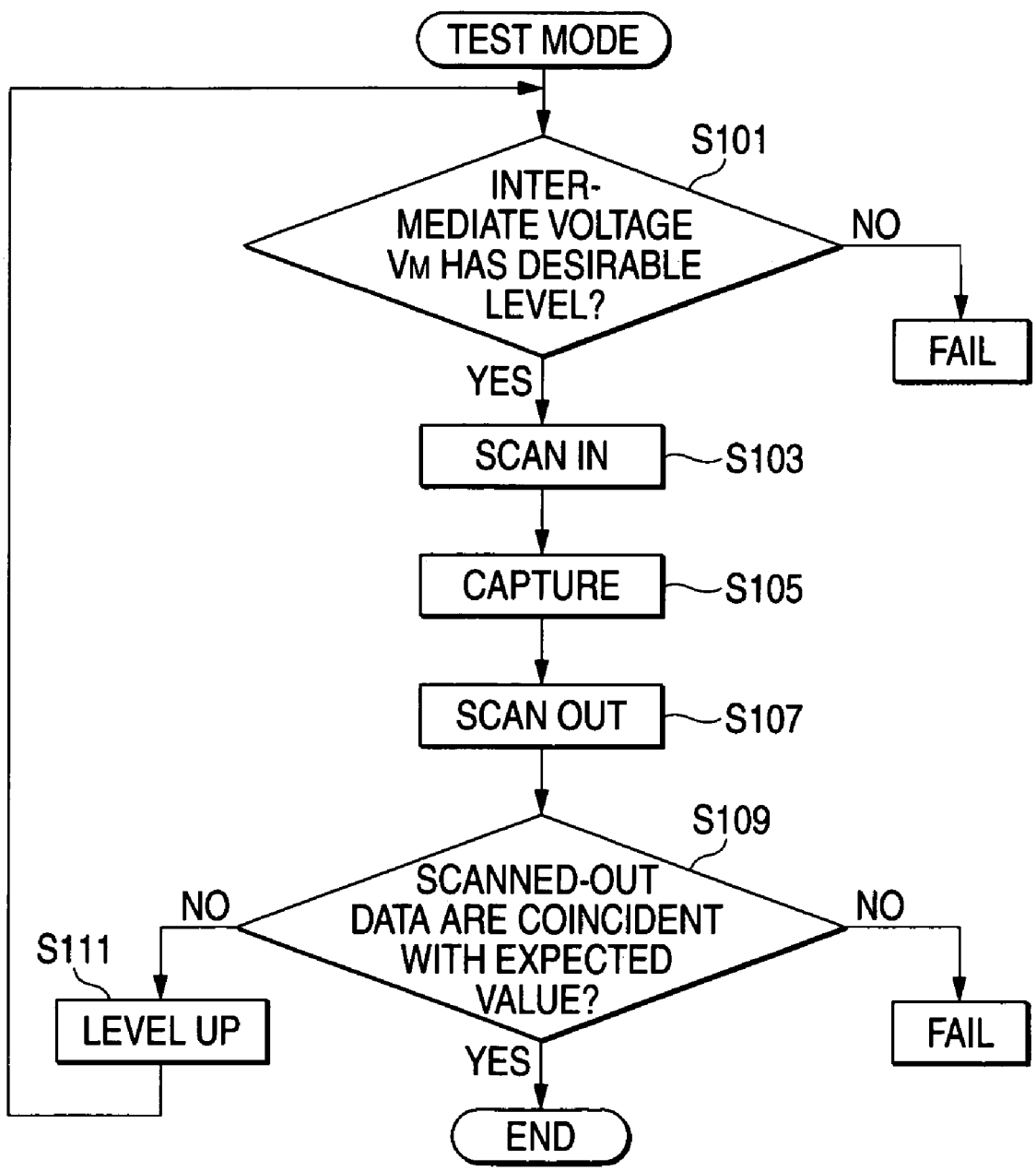
FIG. 7 is a flowchart showing a failure test method using a scan path system which is carried out by the semiconductor integrated circuit according to the first embodiment.

With reference to a flowchart of FIG. 7, next, description will be given to a method of carrying out a failure test using a scan path system by the semiconductor integrated circuit 10 according to the embodiment which comprises the above-mentioned components. When a test mode is set, the FFs 13a to 13f constitute a shift register. Moreover, the signal SC[0] having a different potential than that of a normal mode is input from the test control terminal 21 to the N terminal of each FF and the intermediate voltage $V_M$ of a default is applied from the voltage generating circuit 17 to the T terminal of each FF.

First of all, at a step S101, the voltage determining circuit 19 decides whether or not the intermediate voltage $V_M$ applied to the T terminal has a desirable level. If the condition is satisfied, the processing proceeds to a step S103. If the condition is not satisfied, a decision of FAIL is given and a failure test is ended. At a step S103, next, data are scanned in from the input terminal 23 to the DT terminal of the FF 13a in a front stage. At a step S105, then, data obtained by carrying out a logical operation over the scanned-in data are held (captured) by a scan flip-flop. At a step S107, thereafter, the data are scanned out from the FF 13f in the rear stage by a shift operation.

At a step S109, next, whether the scanned-out data are coincident with an expected value is checked. If they are coincident with each other, a series of processings are ended. If they are not coincident with each other, the processing proceeds to a step S111 in which the feedback signals SC[1] and SC[2] for increasing the level of the intermediate voltage $V_M$ are sent to the voltage generating circuit 17, and the processing returns to the intermediate voltage deciding step in the step S101. At the step S109, the data obtained by an intermediate voltage having the lowest level are checked.

As a result, if they are not coincident with each other, a decision of FAIL is given and the failure test is ended.

Figure 8:
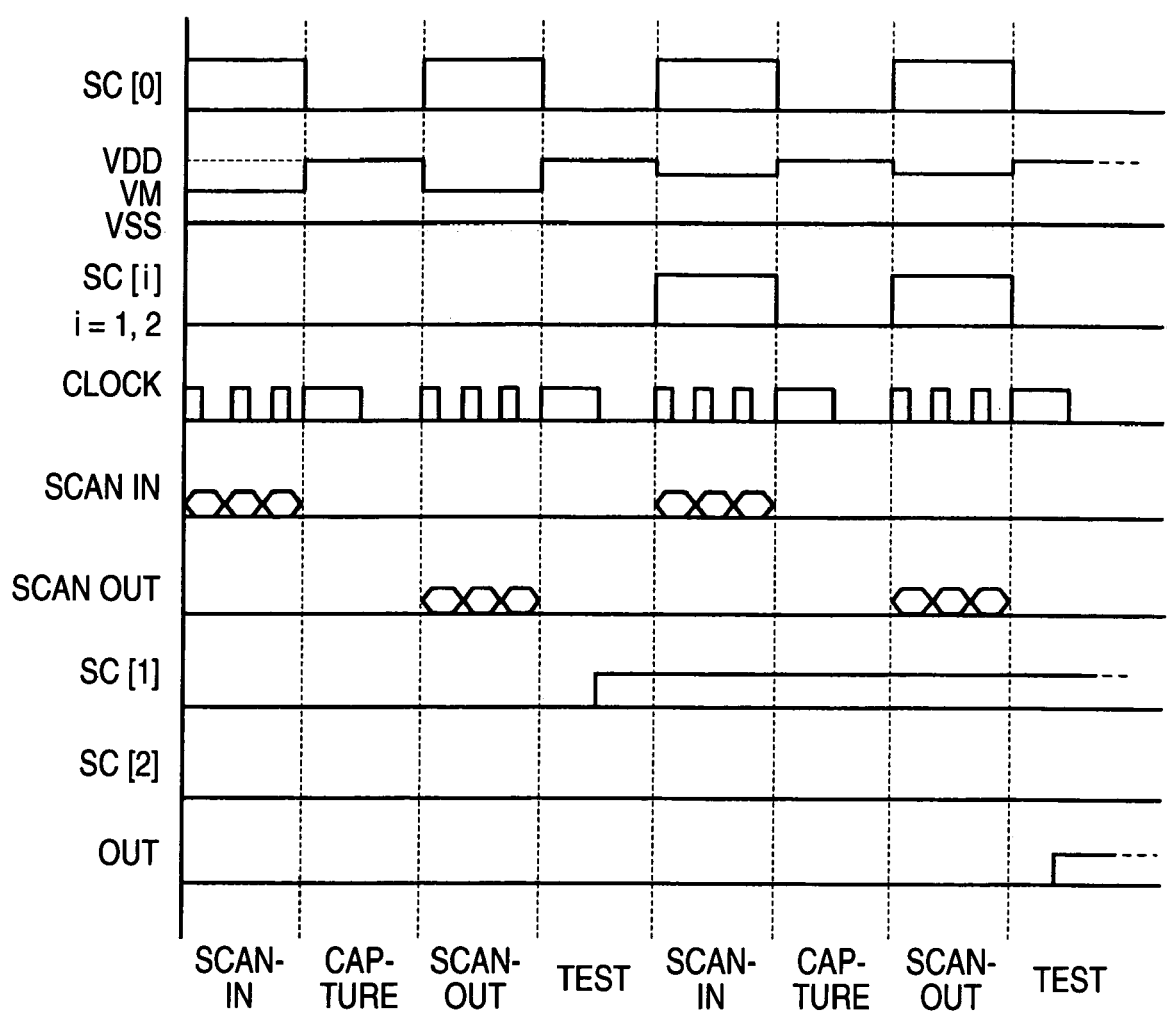
FIG. 8 is a timing chart in the execution of the failure test by a scan path method using the semiconductor integrated circuit according to the first embodiment.

With reference to FIG. 8, next, description will be given to a timing chart in the execution of the failure test by the scan path method using the semiconductor integrated circuit 10 according to the embodiment. FIG. 8 is an example of a timing chart in the execution of the failure test. In the example, the test mode is set and the result of a first check carried out by the test circuit 15 is an error, and the level of the intermediate voltage $V_M$ is thereby increased so that the failure test is completed because of no error in a second check.

As shown in FIG. 8, in the stages of first scan-in and scan-out, the intermediate voltage $V_M$ to be applied from the voltage generating circuit 17 to the T terminal of the FF is $V_{DD}/2$ of a default. In a first check, it is decided that an error is made and feedback signals SC[1] and SC[2]=[1, 0] are supplied from the test circuit 15 to the voltage generating circuit 17 to increase the level of the intermediate voltage $V_M$. In the next scan-in and scan-out stages, consequently, the intermediate voltage $V_M$ having a higher level than the level of $V_{DD}/2$ is applied to the T terminal of the FF so that a delay dime in the scan operation is increased. If it is decided that an error is not made in the next check, a signal indicative of no error is output from the out terminal of the test circuit 15.

As described above, in the semiconductor integrated circuit 10 according to the embodiment, the intermediate voltage $V_M$ to be applied from the voltage generating circuit 17 to the T terminal of the test operation input circuit 55 of each of the FFs 13a to 13f has an electric potential between the supply voltage $V_{DD}$ and the ground voltage $V_{SS}$. Consequently, the delay time of data output from the Q terminal can be increased. Accordingly, it is not necessary to constitute an inverter and a latch in the circuit as in the conventional art. Thus, the mounting area of the semiconductor integrated circuit can be reduced.

Furthermore, in the case in which the data scanned out have an error as a result of the check carried out by the test circuit 15, it is possible to variably set the delay time by increasing the level of the intermediate voltage $V_M$ one by one. Also in the case in which the delay characteristic of a device has a variation, consequently, a countermeasure can be taken flexibly. Even if a microfabrication process progresses to increase the variation in the device, accordingly, a malfunction such as a hold error can be prevented.

Figure 9:
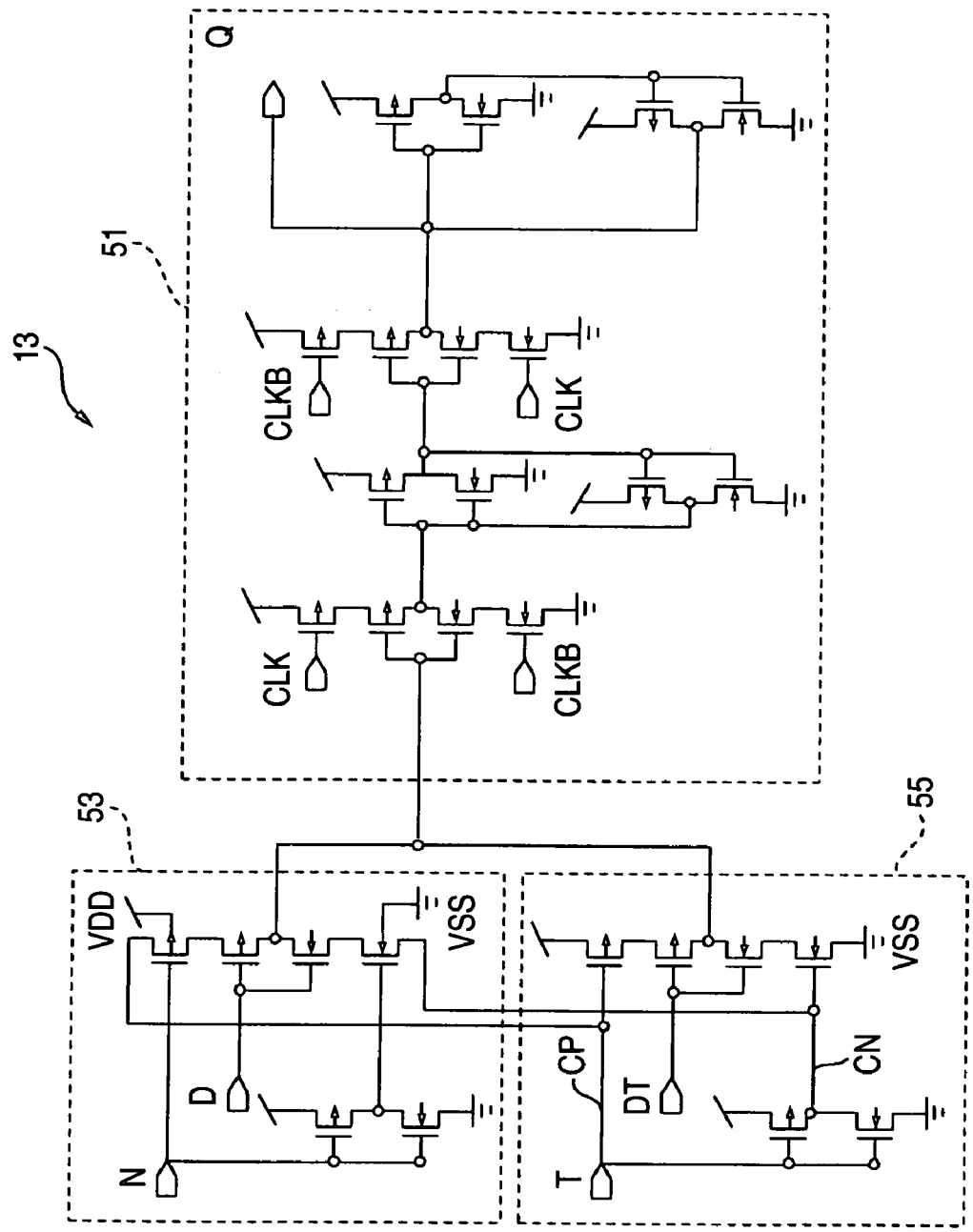
FIG. 9 is a circuit diagram showing the internal structure of a flip-flop according to a first variant.
Figure 10:
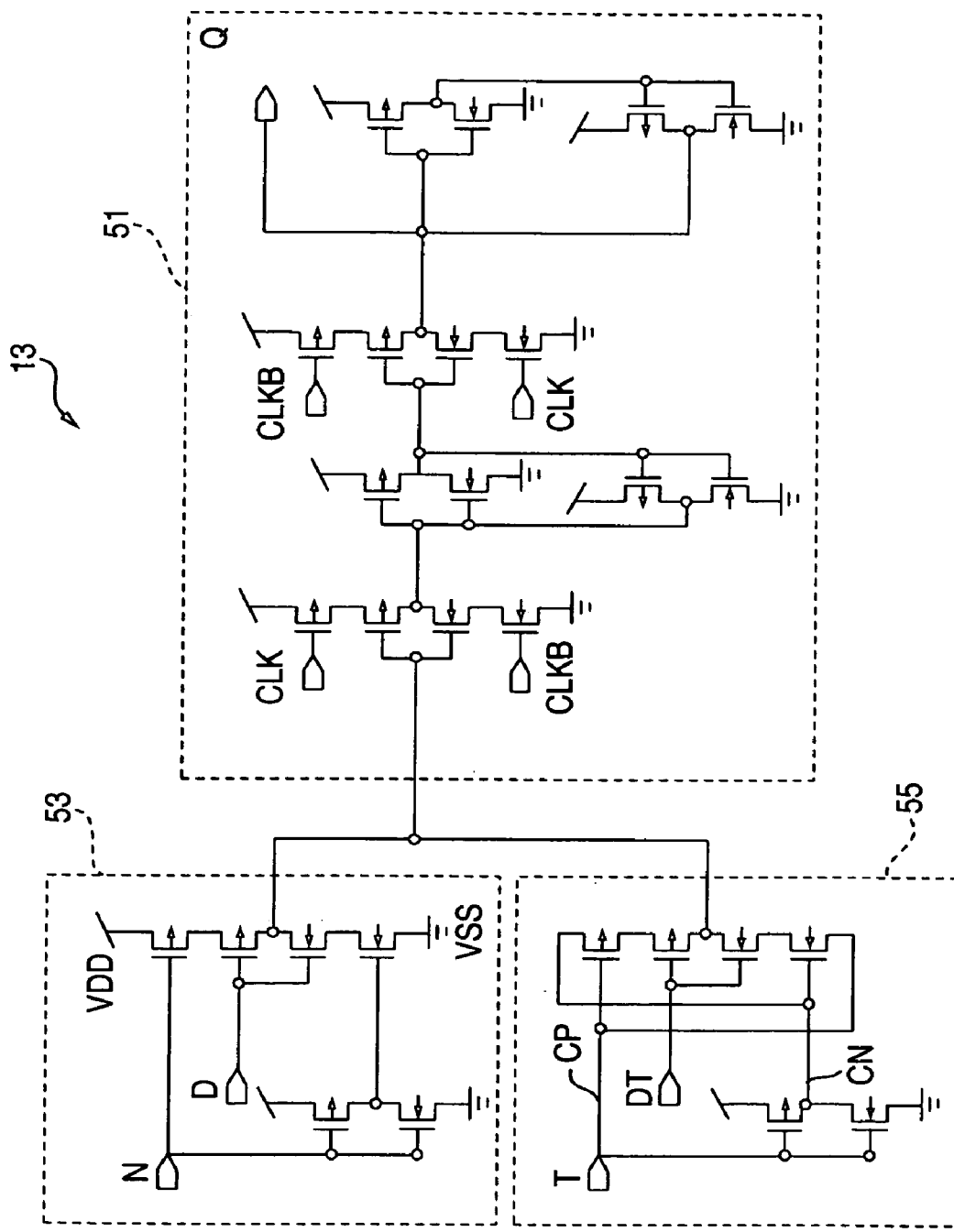
FIG. 10 is a circuit diagram showing the internal structure of the flip-flop according to the first variant.

Next, description will be given to a variant of the normal operation input circuit 53 of each of the FFs 13a to 13f provided in the semiconductor integrated circuit 10 according to the embodiment. First of all, in a first variant, a supply voltage $V_{DD}$ is applied as the source voltage of the FET and $V_{cp}$ and $V_{cn}$ are applied in place of a ground voltage $V_{SS}$, and the substrate bias voltage of the FET to which the source voltage $V_{cp}$ is applied is set to be $V_{DD}$ and the substrate bias voltage of the FET to which the source voltage $V_{cn}$ is applied is set to be $V_{SS}$ as shown in FIGS. 9 and 10. $V_{cp}$ is a voltage applied to the T terminal of the test operation input circuit 55, that is, the intermediate voltage $V_M$, and $V_{cn}$ is an inverted voltage obtained by subtracting the source voltage $V_{cp}$ from the supply voltage $V_{DD}$. In this case, since a leakage current is decreased during the test operation, a consumed current can be reduced.

In a second variant, moreover, a source voltage is maintained, the substrate bias voltage of an FET having a source voltage to be a supply voltage $V_{DD}$ is set to be $V_{cp}$ and the substrate bias voltage of the FET having a source voltage to be a ground voltage $V_{SS}$ is set to be $V_{cn}$. In this case, although a leakage current is increased during a test operation, a forward bias is applied so that a bias current is increased. As a result, a voltage drop is increased so that a drain current is reduced. When the drain current is reduced, a delay time is increased.

Figure 11:
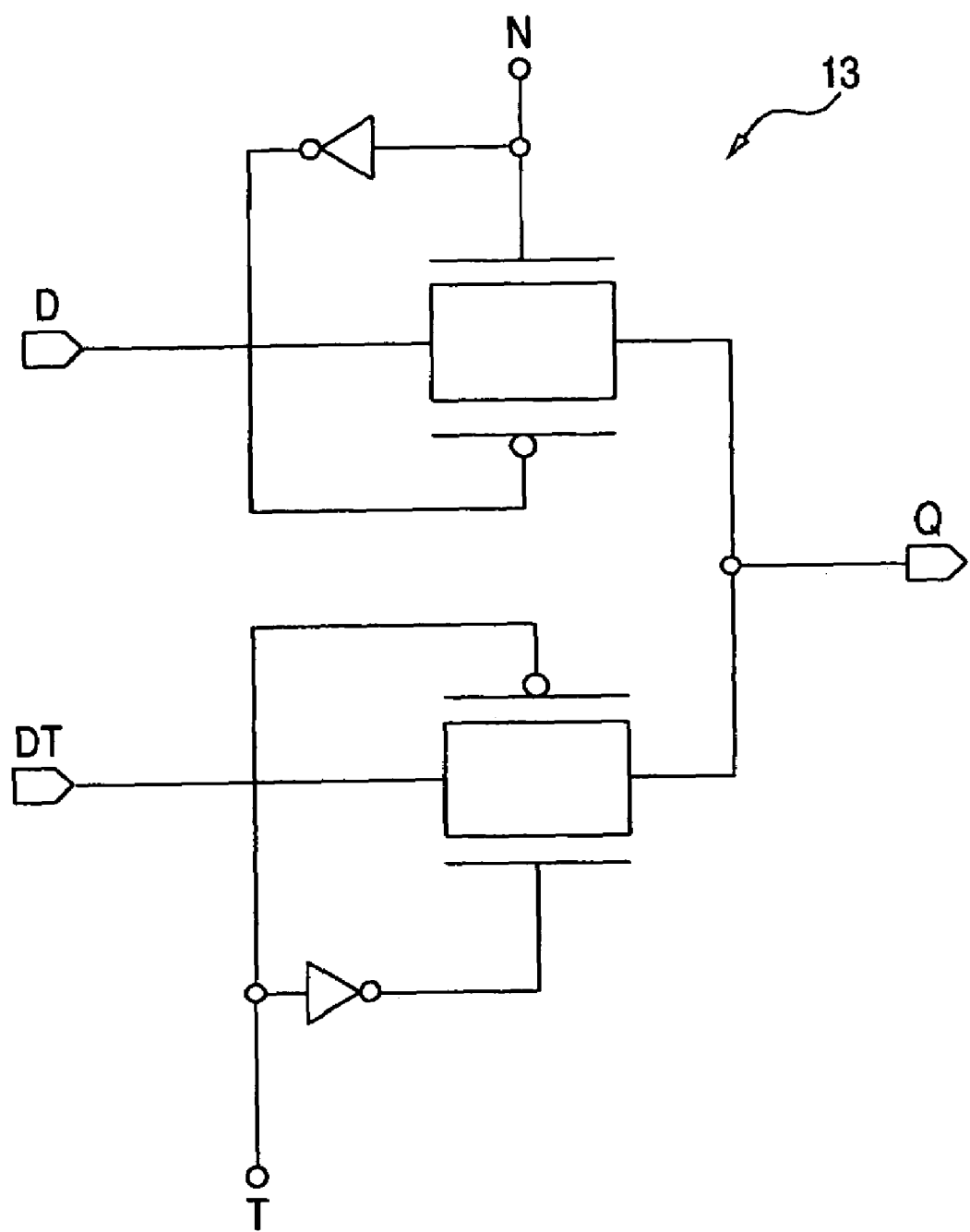
FIG. 11 is a circuit diagram showing a normal operation input circuit and a test operation input circuit which are constituted by a transfer gate according to a third variant.
Figure 12:
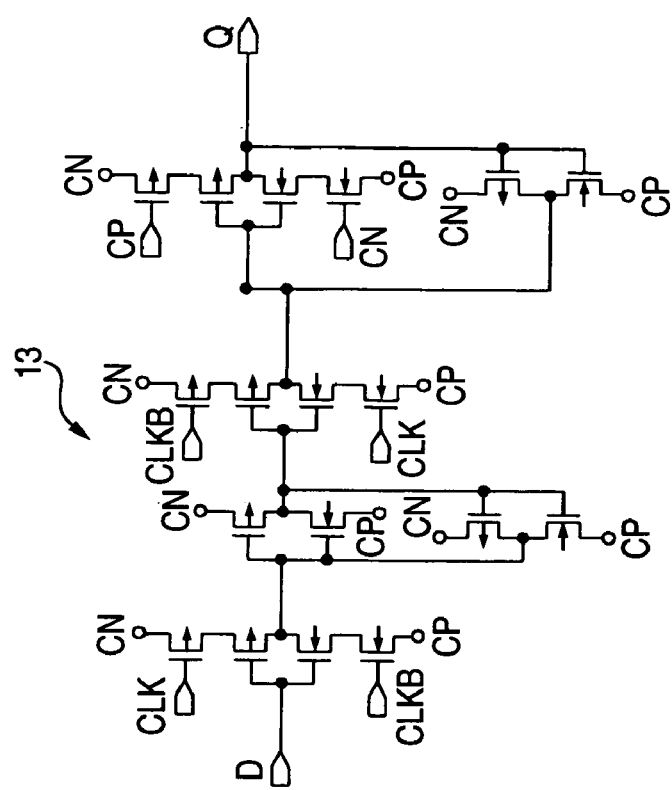
FIGS. 12(a) and 12(b) show the circuit diagrams showing the internal structures of a flip-flop according to a fourth variant.
Figure 12:
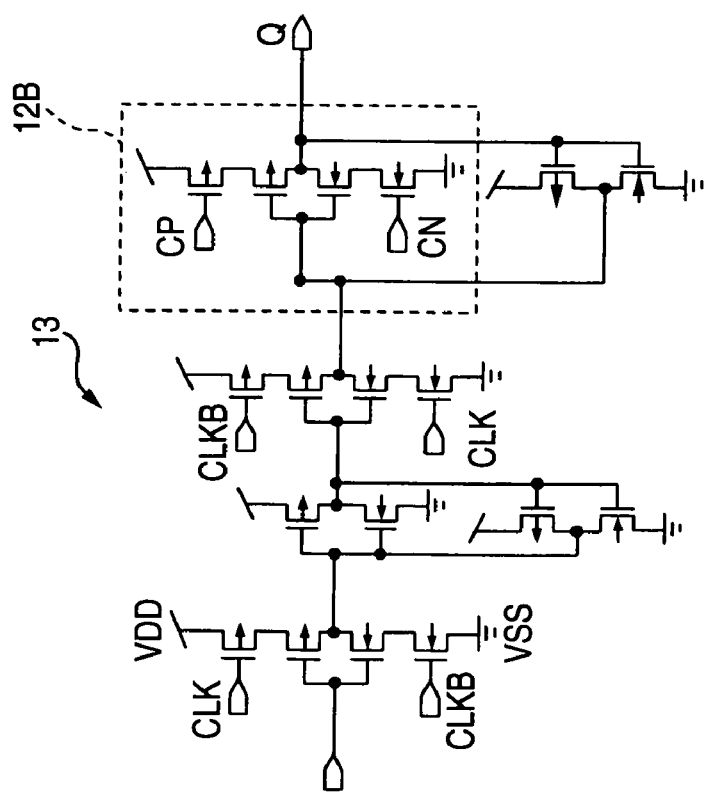

In a third variant, furthermore, the normal operation input circuit 53 and the test operation input circuit 55 are constituted by a transfer gate together as shown in FIG. 11. In this case, the number of elements can be decreased. In a fourth variant, furthermore, a delay circuit 12B is provided in the output circuit 51 of each FF to increase the delay time as shown in FIG. 12. In this case, the source-drain current of the delay circuit 12B is reduced so that the consumed current can be decreased and the delay time can be increased.

Figure 15:
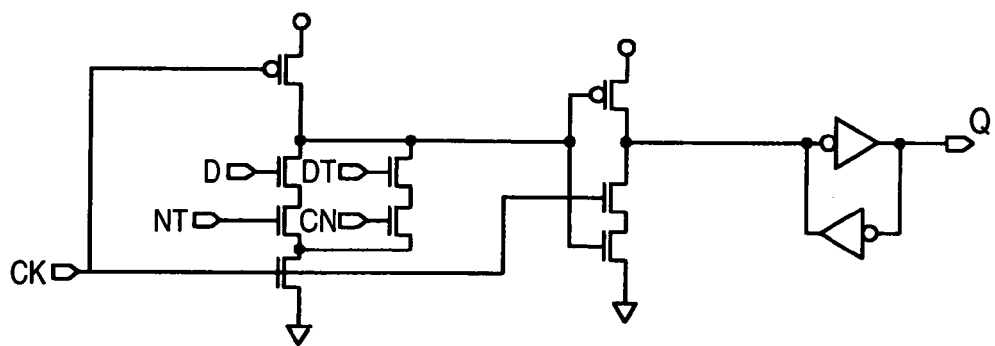
FIG. 15 is a circuit diagram showing a circuit in which an FF of a dynamic type includes a scanning data path and a normal data path which are of such a type as to have a data input terminal connected to only a PMOS or an NMOS.

Also in a circuit in which an FF of a dynamic type includes a scanning data path and a normal data path which are of such a type as to have a data input terminal connected to only a PMOS or an NMOS shown in FIG. 15, it is possible to produce the same advantages by the employing embodiments.

More specifically, FIG. 15 shows the flip-flop circuits of dynamic MUX, where terminal D is a normal data signal input terminal, and terminal DT is a scan shift data terminal. Further, the value at terminal NT is set to the high level in the normal mode, and to the low level in the scan shift mode, whereas that of terminal CN is set to the low level in the normal mode, and varied from low to high level according to the desired value of the scan shift mode.

The data that is retained in the flip-flop is retained therein in case of the clock terminal CK being low level, however, the data of the input terminals D and DT are transferred to the output terminal Q with depending on the conditions of NT and CN terminals when the value of terminal CK is high level.

Having the above mentioned circuitry, if the desired value of the scan shift mode is identified at terminal CN and terminal DT is set to High level, then the discharge capacity of the dynamic MUX becomes low, and consequently the delay of the flip-flop circuit is increased in comparison of CN being set to High level.

While the test circuit 15 and the voltage determining circuit 19 are provided in the semiconductor integrated circuit 10 in the embodiment, they may be provided externally.

Second Embodiment

Figure 13:
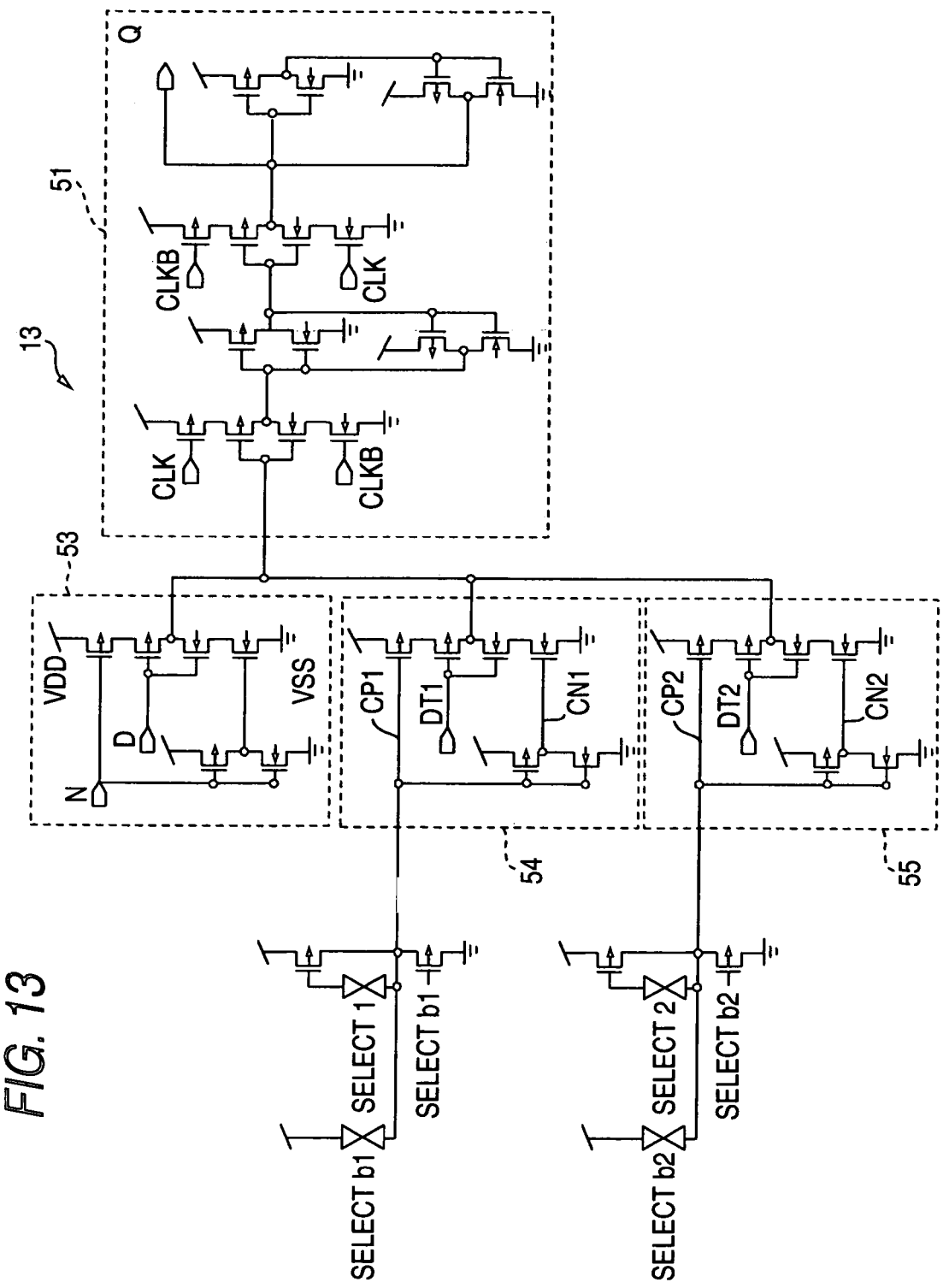
FIG. 13 is a circuit diagram showing the internal structure of a flip-flop provided in a semiconductor integrated circuit according to a second embodiment.
Figure 14:
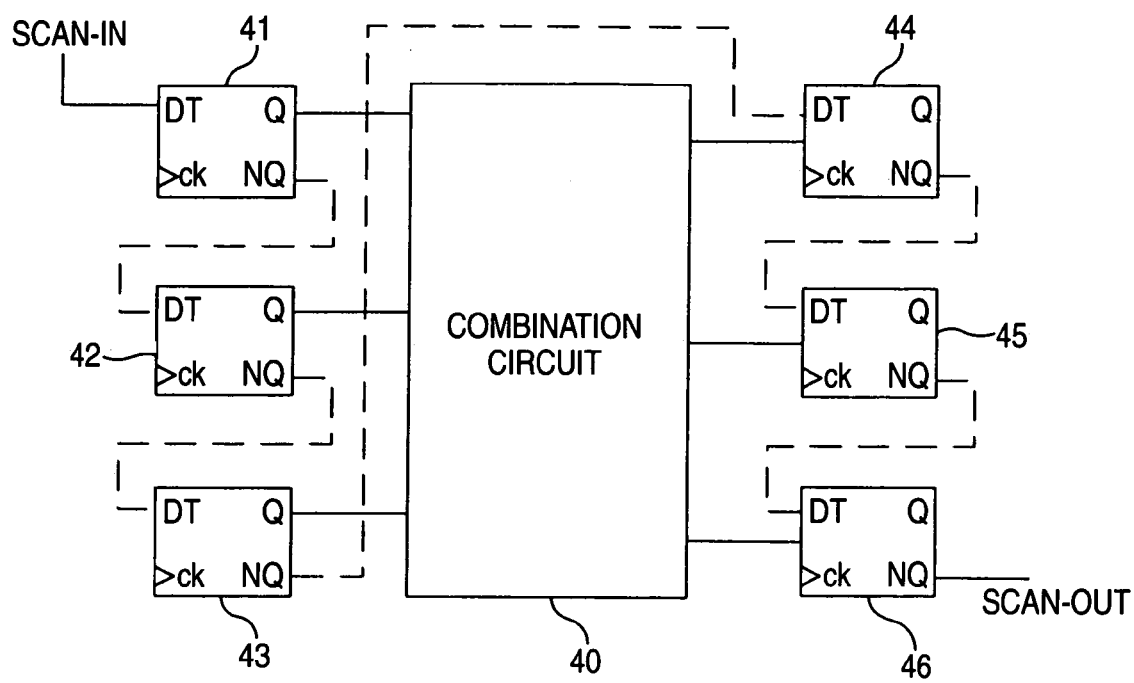
FIG. 14 is a block diagram showing a conventional logic circuit constituted by a D flip-flop and a combinational circuit.

While each of the FFs 13a to 13f has only one test operation input circuit 55 in the semiconductor integrated circuit 10 according to the first embodiment, a plurality of test operation input circuits 55 are provided as shown in FIG. 13 in a second embodiment and delay times are different from each other. By selecting a proper one of the test operation input circuits 55, accordingly, it is possible to variably set the delay time in the same manner as in the first embodiment. Even if the delay characteristic of a device has a variation, therefore, a countermeasure can be taken flexibly.

In the embodiment, the voltage generating circuit 17 does not apply an intermediate voltage $V_M$ to each of the FFs but outputs a feedback signal sent from the test circuit 15 or a signal for selecting the proper test operation input circuit 55 by a default.

As described above, according to the scan path circuit and the semiconductor integrated circuit comprising the scan path circuit in accordance with the invention, it is possible to increase the delay time of data without providing an inverter and a latch. Consequently, a mounting area can be reduced. Even if a microfabrication process progresses so that a variation in a device is increased, moreover, a countermeasure can be taken flexibly. Thus, a malfunction such as a hold error can be prevented more effectively.

What is claimed is:

1. A scan path circuit constituted by a plurality of flip-flops which is operated as a shift register in a separate mode from a normal mode, each of the flip-flops comprising:
   a first input circuit which is selected in the normal mode and data is input in a predetermined timing in the normal mode;
   a second input circuit which is selected in the separate mode which is different from the normal mode and data is input in a predetermined timing in the separate mode; and
   an output circuit for outputting predetermined data corresponding to the data input to the first input circuit or the second input circuit,
   wherein the first input circuit and the second input circuit have terminals to which different control signals for each mode are input, respectively, and
   further wherein a voltage level of a control signal input to the terminal of the second input circuit is changed in the separate mode from the normal mode, said change of said voltage level of the control signal includes a change to a voltage level between a supply voltage and a ground voltage.

2. A scan path circuit constituted by a plurality of flip-flops which is operated as a shift register in a separate mode from a normal mode, each of the flip-flops comprising:
   a first input circuit which is selected in the normal mode and data is input in a predetermined timing in the normal mode;
   a plurality of second input circuits which are selected in a separate mode which is different from the normal mode and have different amounts of an output change of data input in a predetermined timing in the separate mode; and
   an output circuit for outputting predetermined data corresponding to the data input to the first input circuit or the second input circuits,
   wherein the first input circuit and the second input circuits have terminals to which different control signals for each mode are input, respectively, and
   further wherein a voltage level of a control signal input to any of the terminals of the second input circuits is changed in the separate mode from the normal mode, said change of said voltage level of the control signal includes a change to a voltage level between a supply voltage and a ground voltage.

3. The scan path circuit according to claim 1 or 2, wherein the first input circuit or the second input circuit is constituted by a tri-state inverter circuit to be controlled by the control signal and the input data, and an output of the tri-state inverter circuit is connected in common.

4. The scan path circuit according to claim 1 or 2, wherein the first input circuit or the second input circuit is constituted by a transfer gate circuit to be controlled by the control signal and the input data, and an output of the transfer gate circuit is connected in common.

5. The scan path circuit according to claim 3, wherein the tri-state inverter circuit applies a voltage having the same level as that of the control signal in place of a supply voltage and applies a voltage having a value obtained by subtracting the voltage having the same level as that of the control signal from the supply voltage in place of a ground voltage in the normal mode.

6. The scan path circuit according to claim 3, wherein a substrate bias voltage of the tri-state inverter circuit is the voltage having the same level as that of the control signal or a voltage having a value obtained by subtracting the voltage having the same level as that of the control signal from a supply voltage in the normal mode.

7. A data holding circuit comprising:
   a first input circuit which is selected in a normal mode and data is input in a predetermined timing in the normal mode;
   a second input circuit which is selected in a separate mode which is different from the normal mode and data is input in a predetermined timing in the separate mode; and
   an output circuit for outputting predetermined data corresponding to the data input to the first input circuit or the second input circuit,
   wherein the first input circuit and the second input circuit have terminals to which different control signals for each mode are input, respectively, and
   further wherein a voltage level of a control signal input to the terminal of the second input circuit is changed in the separate mode from the normal mode, said voltage level of a control signal being intermediate voltage.

8. A data holding circuit comprising:
   a first input circuit which is selected in a normal mode and data is input in a predetermined timing in the normal mode;
   a plurality of second input circuits which are selected in a separate mode which is different from the normal mode and have different amounts of an output change of data input in a predetermined timing in the separate mode; and
   an output circuit for outputting predetermined data corresponding to the data input to the first input circuit or the second input circuits,
   wherein the first input circuit and the second input circuits have terminals to which different control signals for each mode are input, respectively, and
   further wherein a voltage level of a control signal input to any of the terminals of the second input circuits is changed in the separate mode from the normal mode, said voltage level of a control signal being intermediate voltage.

* * * * *